United States Patent
Spaulding

(12) 
(10) Patent No.: US 11,019,741 B2
(45) Date of Patent: May 25, 2021

(54) APPARATUS FOR PROTECTING TELECOMMUNICATION RADIOS AND METHODS OF USING THE SAME

(71) Applicant: CommScope Technologies LLC, Hickory, NC (US)

(72) Inventor: Mark George Spaulding, Wylie, TX (US)

(73) Assignee: CommScope Technologies LLC, Hickory, NC (US)

( * ) Notice: Subject to any disclaimer, the term of this patent is extended or adjusted under 35 U.S.C. 154(b) by 36 days.

(21) Appl. No.: 16/386,614

(22) Filed: Apr. 17, 2019

(65) Prior Publication Data

US 2019/0327845 A1   Oct. 24, 2019

Related U.S. Application Data

(60) Provisional application No. 62/661,877, filed on Apr. 24, 2018.

(51) Int. Cl.
  *A47B 81/00* (2006.01)
  *H05K 5/02* (2006.01)
  *H05K 5/03* (2006.01)

(52) U.S. Cl.
  CPC ............ *H05K 5/0221* (2013.01); *H05K 5/03* (2013.01)

(58) Field of Classification Search
  CPC ......... H05K 5/03; H05K 5/0221; G06F 1/181
  See application file for complete search history.

(56) References Cited

U.S. PATENT DOCUMENTS

| | | | | |
|---|---|---|---|---|
| 5,944,398 A | * | 8/1999 | Wu | H05K 7/18 312/223.2 |
| 5,975,659 A | * | 11/1999 | Yang | G06F 1/181 312/223.2 |
| 6,231,140 B1 | * | 5/2001 | Chen | G06F 1/181 312/223.2 |
| 6,382,744 B1 | * | 5/2002 | Xiao | G06F 1/181 312/223.2 |
| 6,908,338 B2 | * | 6/2005 | Okamoto | G06F 1/182 439/607.02 |
| 2003/0090874 A1 | * | 5/2003 | Okamoto | H05K 9/0073 361/705 |
| 2006/0279918 A1 | * | 12/2006 | Shi | G06F 1/181 361/679.02 |
| 2007/0284977 A1 | * | 12/2007 | Lin | G06F 1/181 312/223.2 |
| 2015/0075080 A1 | * | 3/2015 | Ellingson | H05K 5/061 49/483.1 |
| 2018/0249595 A1 | * | 8/2018 | Ashbaugh | H05K 5/0213 |
| 2019/0307006 A1 | * | 10/2019 | Zhou | H05K 5/0217 |
| 2020/0315046 A1 | * | 10/2020 | Sato | H05K 5/0226 |

* cited by examiner

*Primary Examiner* — Matthew W Ing
(74) *Attorney, Agent, or Firm* — Myers Bigel, P.A.

(57) ABSTRACT

The present application describes an apparatus for protecting telecommunications radios. Methods of using the same are also provided.

17 Claims, 8 Drawing Sheets

APPARATUS FOR PROTECTING TELECOMMUNICATION RADIOS AND METHODS OF USING THE SAME

RELATED APPLICATION

The present application claims priority from and the benefit of U.S. Provisional Patent Application No. 62/661,877, filed Apr. 24, 2018, the disclosure of which is hereby incorporated herein in its entirety.

FIELD OF THE INVENTION

The present invention relates to an apparatus for protecting telecommunications radios and methods of using the same.

BACKGROUND OF THE INVENTION

Cabinets for electronic equipment have become popular in recent years, and are now routinely used in both indoor and outdoor applications. These cabinets, which are typically made of metal, are used to protect and provide convenient access to a wide variety of electronic equipment. They can protect a wide range of electronic equipment including, but not limited to, radios, multicarrier power amplifiers (MCPA), power supplies, batteries, and wireless cell site backhaul equipment. These cabinets can protect the electronic equipment from environmental conditions and/or tampering, and may also provide RF shielding to the electronic equipment.

Typically, telecommunications radios have been mounted at the top of telecommunications towers. But recently there has been a trend to move the telecommunications radios to ground-level near the electronic equipment cabinets. Because of spacing constraints within these cabinets, the telecommunications radios are typically attached to an exterior wall of these cabinets.

When these telecommunications radios are installed outside of the cabinet, metal shrouds are used to protect them from environmental conditions and/or tampering. However, the metal shrouds that are currently available typically require two or more people to mount and typically only use a conventional padlock for security. Thus, metal shrouds that can be installed by one person and/or have better security features are desired.

SUMMARY OF THE INVENTION

A first aspect of the present invention is directed to a radio cover assembly comprising a removable shroud. The removable shroud comprises three side walls and a ceiling that form an interior cavity dimensioned to fit over a telecommunications radio mounted on a telecommunications cabinet wall. The ceiling of the removable shroud has a latching member configured to be received in an upper mounting member on the telecommunications cabinet wall. At least two mounting hooks are attached to the removable shroud. Each of the at least two mounting hooks is sized to insert into a respective lower mounting member on the telecommunications cabinet wall. A locking device is attached to the removable shroud and configured to engage a locking member attached to the telecommunications cabinet wall.

Another aspect of the present invention is directed to a telecommunications cabinet assembly comprising a telecommunications cabinet having a cavity for housing telecommunications equipment, at least one telecommunications radio mounted to a cabinet wall exterior to the cavity, an upper mounting member attached to the cabinet wall, at least two lower mounting members on the cabinet wall, a locking member attached to the cabinet wall, and a radio cover assembly. The radio cover assembly comprises a removable shroud, the removable shroud comprising three side walls and a ceiling that form an interior cavity dimensioned to fit over the at least one telecommunications radio, the ceiling of the removable shroud having a latching member received in the upper mounting member; at least two mounting hooks attached to the removable shroud, each of the at least two mounting hooks inserted into a respective lower mounting member; and a locking device attached to the removable shroud, the locking device configured to engage with the locking member, thereby securing the removable shroud to the cabinet wall when the locking device is in a locked position.

A further aspect of the present invention is directed to a method for protecting a telecommunications radio mounted to an exterior of a telecommunications cabinet wall, the method comprising: providing a removable shroud, the removable shroud comprising three side walls and a ceiling that form an interior cavity dimensioned to fit over the telecommunications radio, the ceiling of the removable shroud having a latching member, at least two mounting hooks attached to the removable shroud, and a locking device attached to the removable shroud; positioning the removable shroud over the telecommunications radio such that (a) the latching member is received in an upper mounting member attached to the telecommunications cabinet wall and (b) each of the at least two mounting hooks insert into a respective lower mounting member on the telecommunications cabinet wall; and engaging the locking device with a locking member attached to the telecommunications cabinet wall to prevent the removal of the removable shroud from the telecommunications cabinet wall.

It is noted that aspects of the invention described with respect to one embodiment, may be incorporated in a different embodiment although not specifically described relative thereto. That is, all embodiments and/or features of any embodiment can be combined in any way and/or combination. Applicant reserves the right to change any originally filed claim and/or file any new claim accordingly, including the right to be able to amend any originally filed claim to depend from and/or incorporate any feature of any other claim or claims although not originally claimed in that manner. These and other objects and/or aspects of the present invention are explained in detail in the specification set forth below. Further features, advantages and details of the present invention will be appreciated by those of ordinary skill in the art from a reading of the figures and the detailed description of the preferred embodiments that follow, such description being merely illustrative of the present invention.

DETAILED DESCRIPTION OF THE INVENTION

Figure 1:
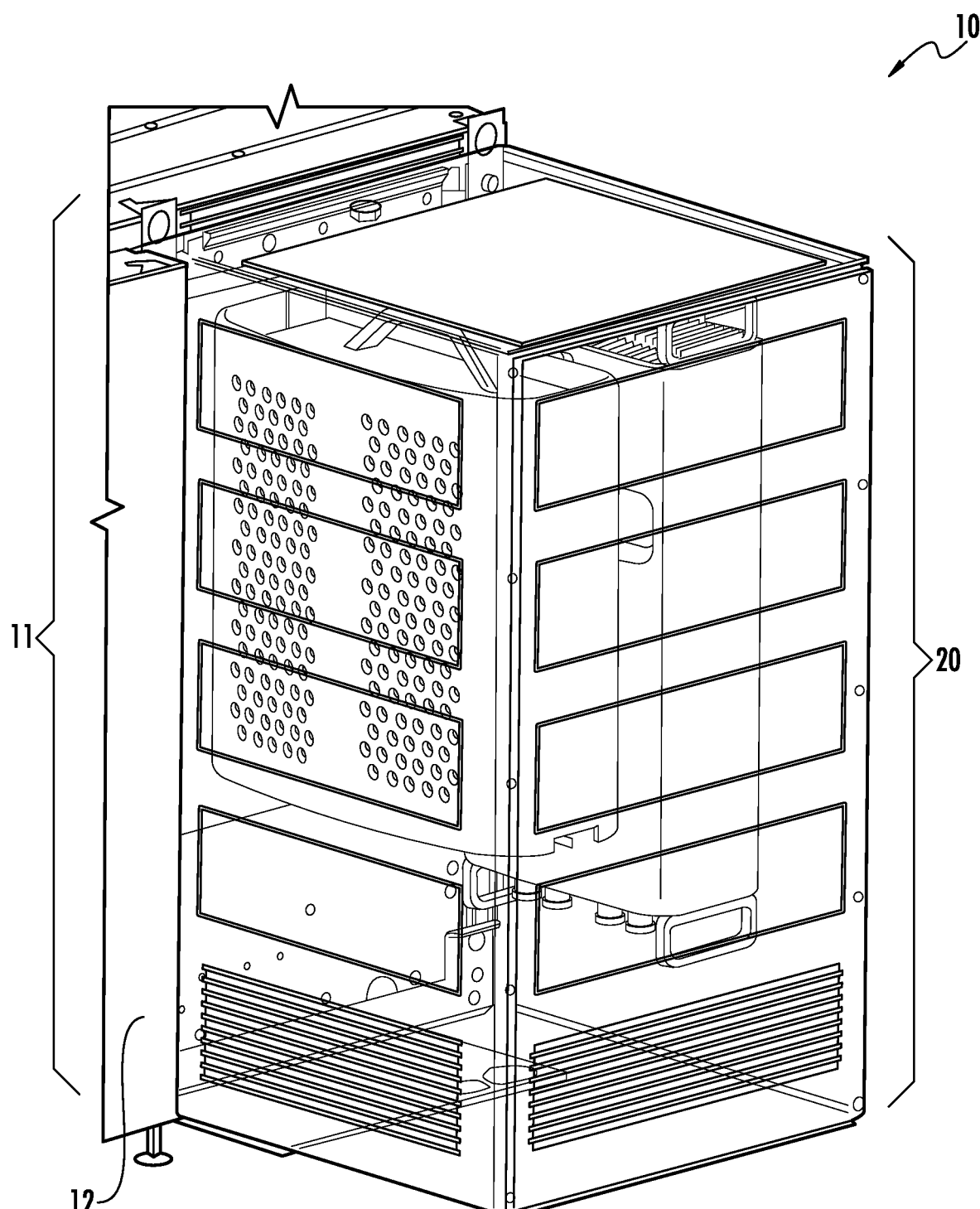
FIG. 1 is a front perspective view of a telecommunications cabinet assembly according to embodiments of the present invention.

The present invention now is described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

The present invention now will be described more fully hereinafter with reference to the accompanying drawings, in which illustrative embodiments of the invention are shown.

In the figures, certain layers, components or features may be exaggerated for clarity, and broken lines illustrate optional features or operations unless specified otherwise. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention. The sequence of operations (or steps) is not limited to the order presented in the claims or figures unless specifically indicated otherwise.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

Referring now to the figures, a telecommunications cabinet assembly 10 according to some embodiments of the present invention is illustrated in FIG. 1. The telecommunications cabinet assembly 10 may comprise a telecommunications cabinet 11 and a radio cover assembly 20. The telecommunications cabinet 11 may have a plurality of cabinet walls 12. Together, the cabinet walls 12 can form an open cavity which may be used to house telecommunications equipment 13 (see, e.g., FIG. 2A). Types of exemplary telecommunications equipment that may be housed within the telecommunications cabinet 11 include, but are not limited to, multi-carrier power amplifiers, house power cells, routers, switching equipment, transmission equipment, power supplies, batteries, wireless cell site backhaul equipment, baseband units, Fiber Panels, OVPs, or the like.

Figure 2A:
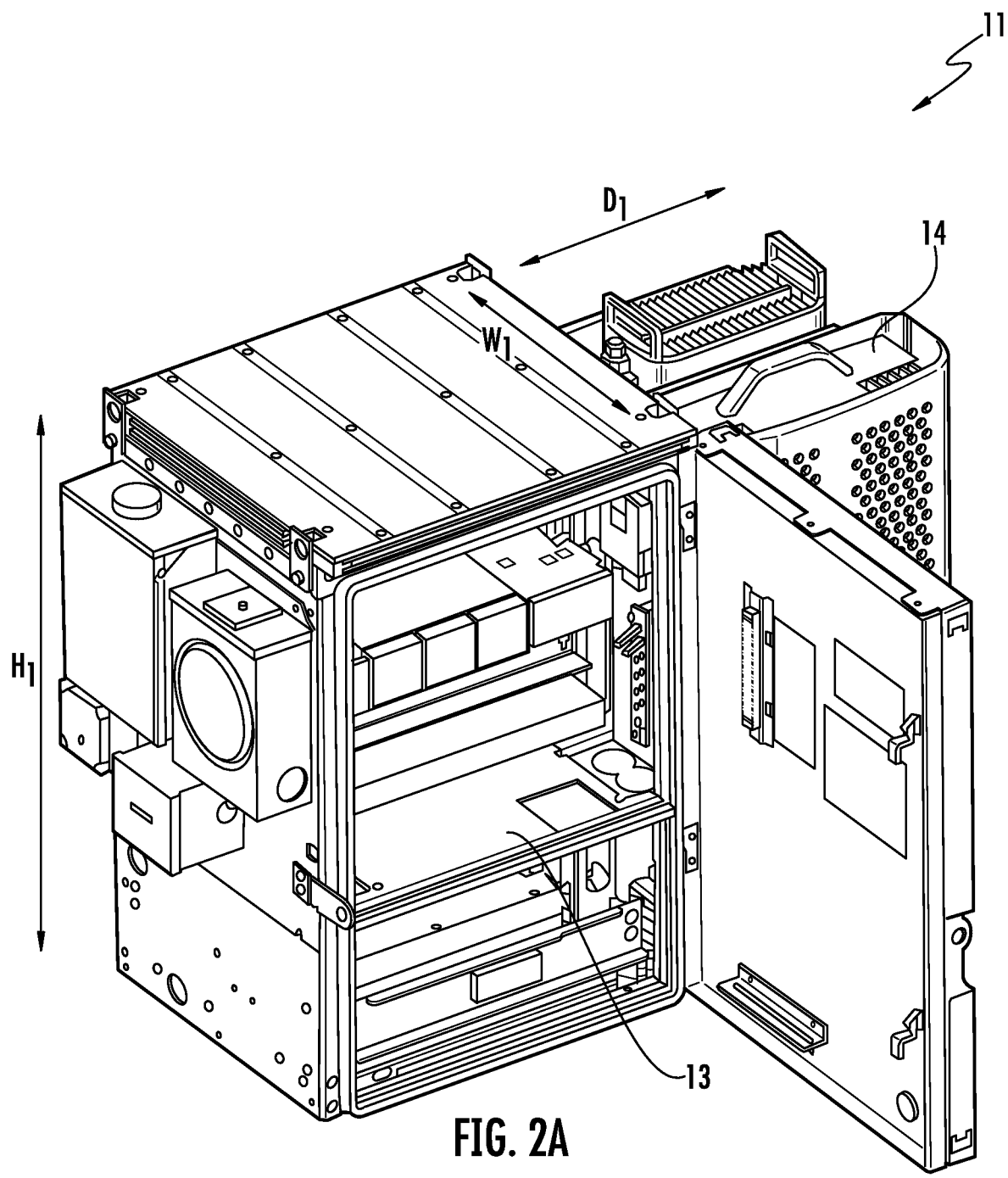
FIG. 2A is a back perspective view of the telecommunications cabinet assembly of FIG. 1 with the shroud removed to show telecommunications radios mounted to the telecommunications cabinet.
Figure 2B:
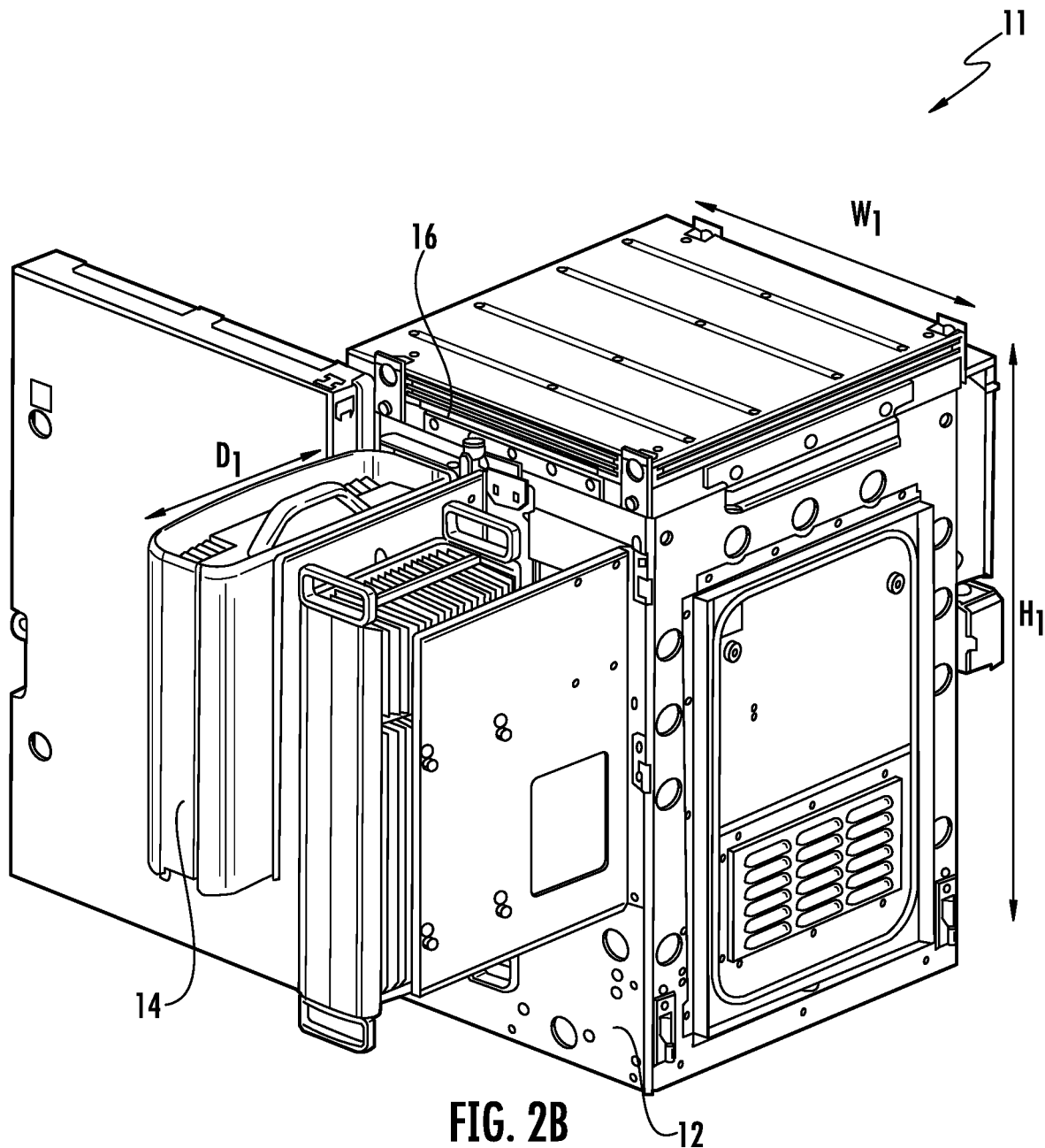
FIG. 2B is a front perspective view of the telecommunications cabinet assembly of FIG. 2A.

As shown in FIGS. 2A and 2B, in some embodiments, at least one telecommunications radio 14 may be mounted to at least one of the telecommunications cabinet walls 12. Due to space constraints within the telecommunications cabinet 11, the at least one telecommunications radio 14 is mounted on the exterior side of the telecommunications cabinet wall 12 (as opposed to the within the open cavity of the telecommunications cabinet 11). The telecommunications cabinet wall 12 on which the at least one telecommunications radio 14 is mounted may also comprise at least one upper mounting member 16, at least two lower mounting members 18 (see, e.g., FIGS. 4A-4B), and a locking member 36 (see, e.g., FIGS. 5A-5C).

Figure 5A:
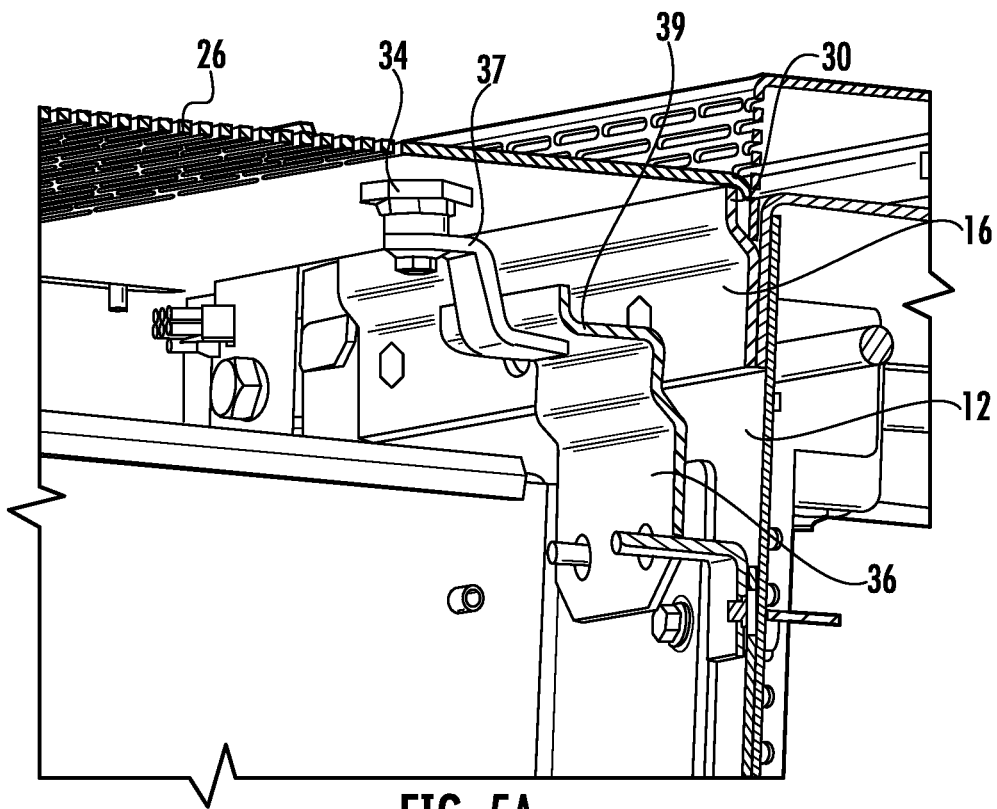
FIG. 5A is a front right perspective view of a locking device and locking member of the telecommunications cabinet assembly of FIG. 1.
Figure 5B:
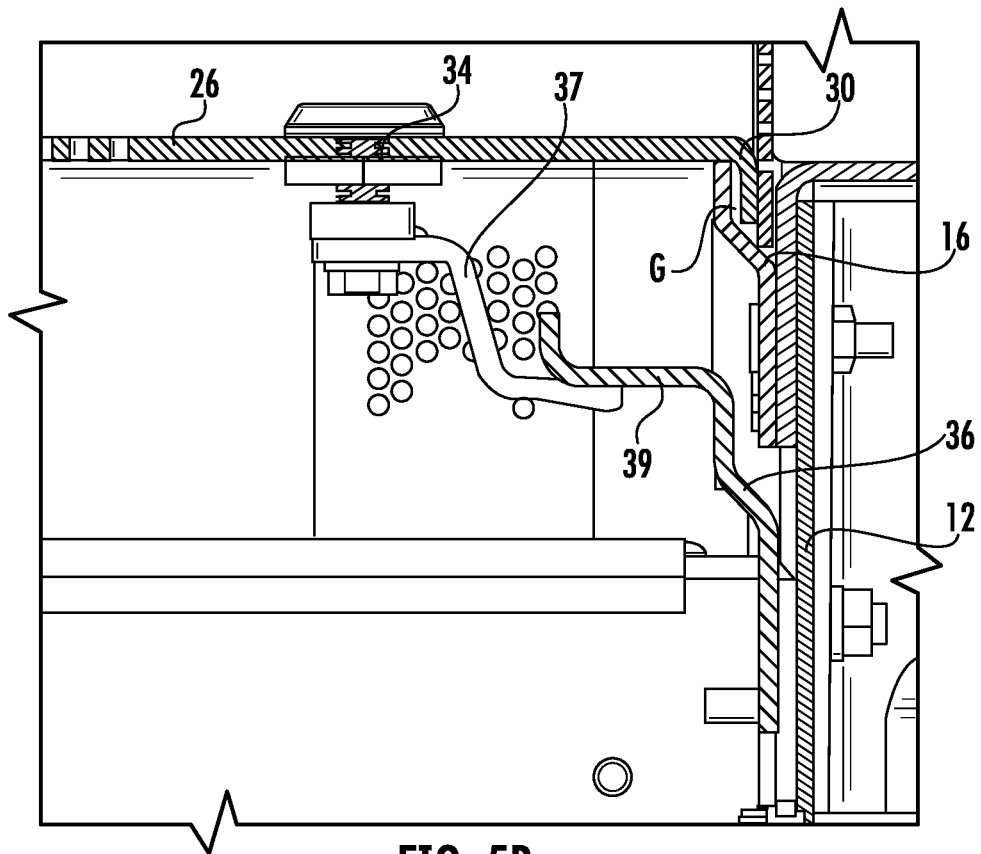
FIG. 5B is a side view of the locking device and locking member of FIG. 5A.

The upper mounting member 16 may be configured such that, when the upper mounting member 16 is attached to the telecommunications cabinet wall 12, a gap (G) is formed between the telecommunications cabinet wall 12 and upper mounting member 16 (see, e.g., FIG. 5B). The gap (G) is sized to allow a latching member, such as a downwardly-bent edge 30, to secure onto the upper mounting member 16. In some embodiments, the upper mounting member 16 may be a bracket that extends the width ($W_1$) of the telecommunications cabinet wall 12. In some embodiments, there may be two or more upper mounting members 16 attached to the telecommunications cabinet wall 12.

The at least two lower mounting members 18 comprise slots 19 that may be configured to receive mounting hooks 32 (which will be discussed in further detail below). The slots 19 of the lower mounting members 18 can vary in size and shape based on the mounting hooks 32. In some embodiments, the at least two lower mounting members 18 may be integrally formed with a bracket 21 that extends the width ($W_1$) of the telecommunications cabinet wall 12. In some embodiments, the lower mounting members 18 may be integrally formed with more than one bracket 21 attached near the base of the telecommunications cabinet wall 12.

In some embodiments, the present invention can utilize upper and lower mounting member 16 that may already be attached to the telecommunications cabinet wall 12 and may have been used for pole mounting. In some embodiments, the upper and lower mounting member 16 may be installed on the telecommunications cabinet wall 12 prior to being used.

The locking member 36 is attached to the telecommunications cabinet wall 12 below the upper mounting bracket 16 and is configured such that the locking member 36 extends out from the telecommunications cabinet wall 12. In some embodiments, the locking member 36 comprises a locking member arm 39. The locking member arm 39 can be configured to allow a locking device 34, such as lockable quarter-turn latch, to engage with the locking member 36. The upper mounting member 16, lower mounting members 18 (and/or bracket(s) 21 comprising the lower mounting members 18), and locking member 36 may be attached to the telecommunication cabinet wall 12 in number of different ways, for example, via bolts, screws, welds or the like.

Figure 3A:
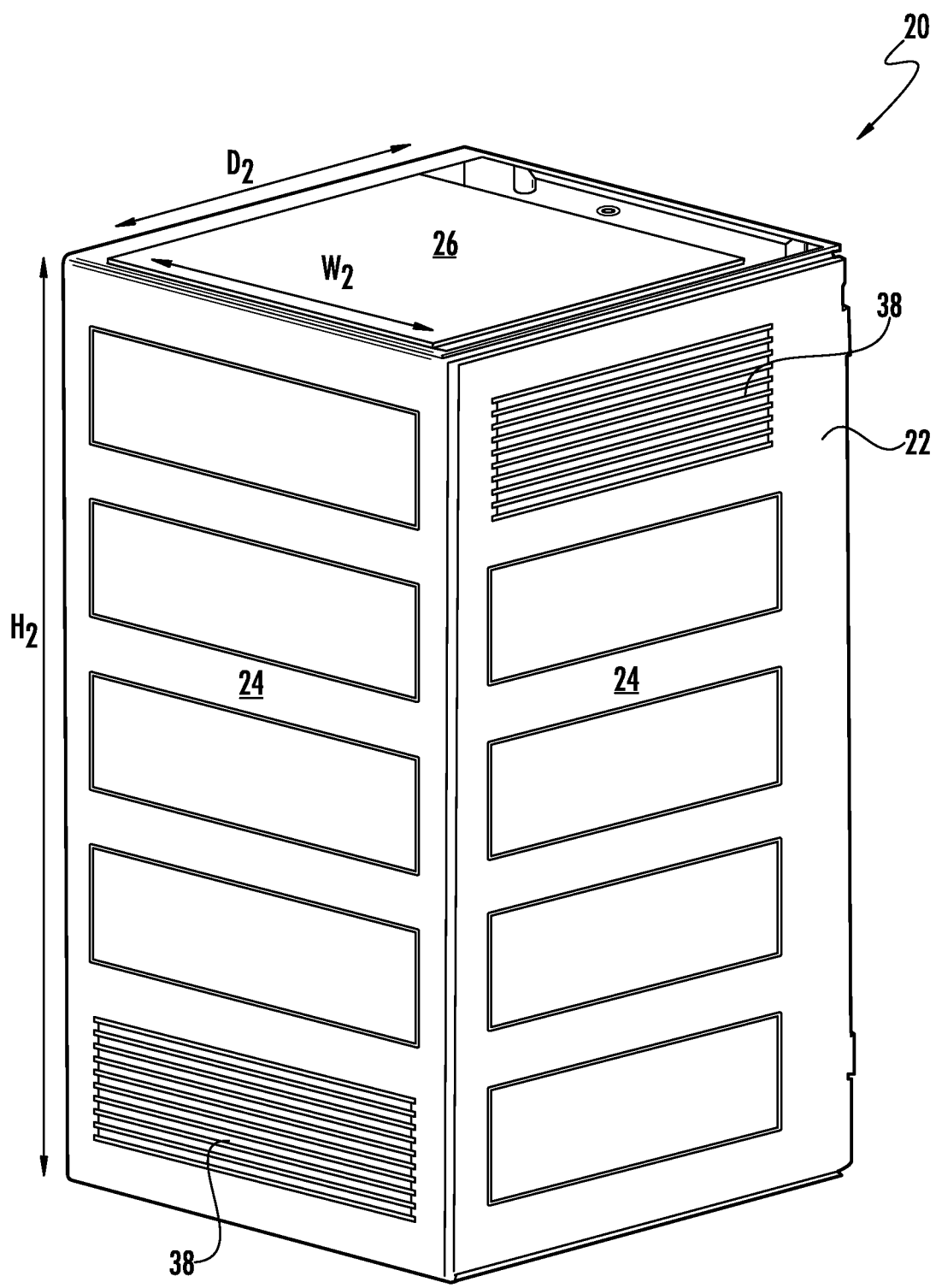
FIG. 3A is a front perspective view of the shroud of FIG. 1 according to embodiments of the present invention.
Figure 3B:
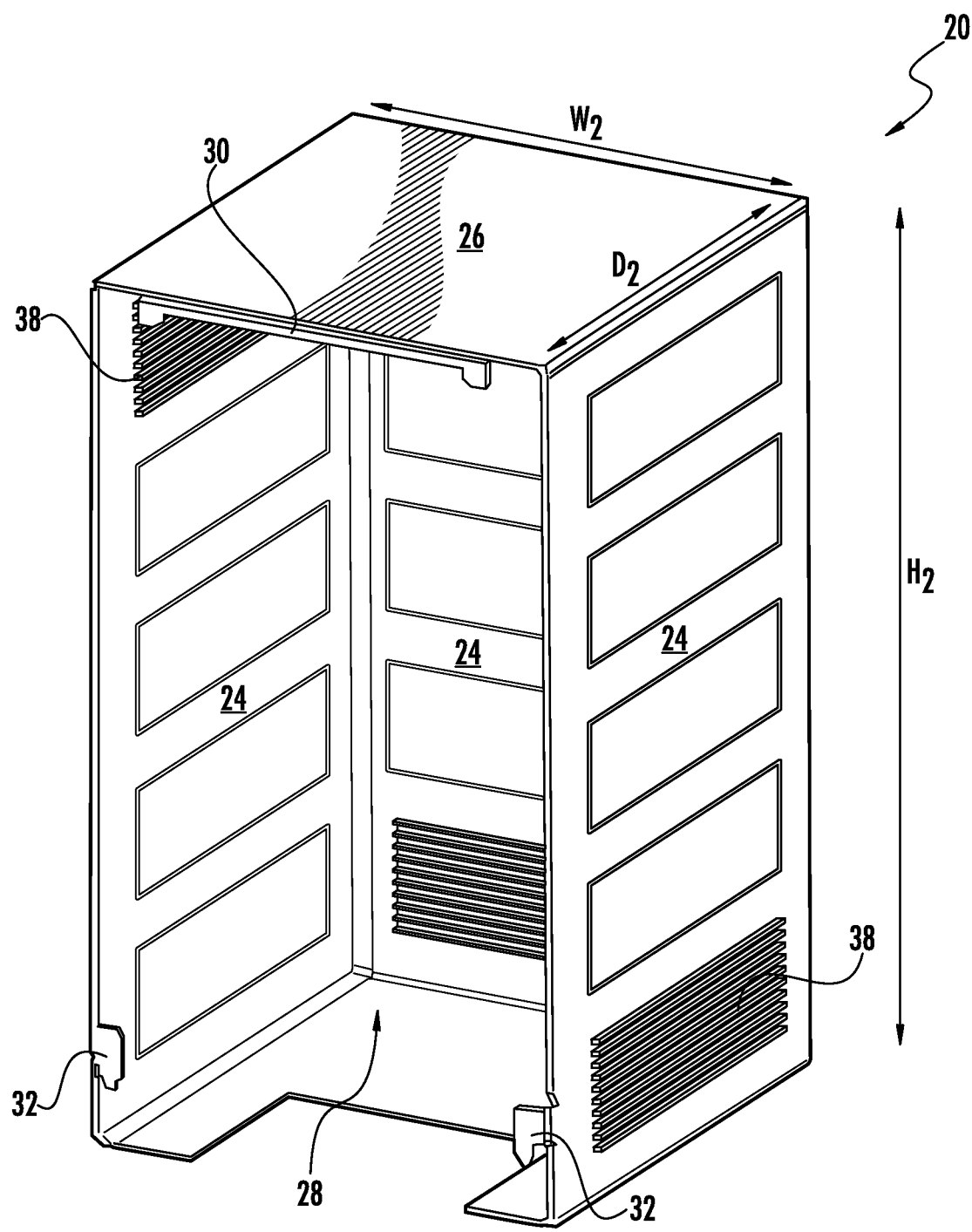
FIG. 3B is a rear perspective view of the shroud of FIG. 3A.

As mentioned above, in some embodiments, the telecommunications cabinet assembly 10 may also comprise a radio cover assembly 20. As shown in FIGS. 3A and 3B, in some embodiments, the radio cover assembly 20 may comprise a removable shroud 22. The removable shroud 22 may comprise three side walls 24 and a ceiling 26. Together, the three side walls 24 and the ceiling 26 of the removable shroud 22 may form an interior cavity 28.

In some embodiments, the interior cavity 28 may be dimensioned to fit over the at least one telecommunications radio 14 mounted to the telecommunications cabinet wall 12. Generally, a telecommunications cabinet wall 12 may have a height ($H_1$) from about 3 feet to about 4 feet and a width ($W_1$) of about 2 feet to about 2.5 feet. When mounted on the exterior of a telecommunications cabinet wall 12, a telecommunications radio 14 can extend out from the telecommunications cabinet wall 12 a depth ($D_1$) from about 21 inches to about 24 inches. Accordingly, in some embodiments of the present invention, the interior cavity 28 may have a height ($H_2$) from about 3 feet to about 4 feet, a width ($W_2$) from about 21 inches to about 24 inches and a depth ($D_2$) from about 21 inches to about 24 inches.

The removable shroud 22 may be made from lighter weight materials that will reduce the overall weight of the removable shroud 22. In some embodiments, the removable shroud 22 may comprise steel, aluminum, or the like. Having a lighter weight removable shroud 22 can reduce the number of technicians needed in the field for installation or removal.

Still referring to FIGS. 3A and 3B, in some embodiments, the ceiling 26 of the removable shroud 22 may comprise a latching member 27. The latching member 27 may be attached to or integrally formed with the ceiling 26 of the removable shroud 22. In some embodiments, the latching member 27 may be a downwardly-bent edge 30 of the ceiling 26 of the removable shroud 22. The latching member 27 or downwardly-bent edge 30 of the ceiling 26 may be configured to be received in the upper mounting member 16 located on the telecommunications cabinet wall 12. As mentioned above, the latching member 27 or downwardly-bent edge 30 can be received within the gap (G) formed between the upper mounting member 16 and the telecommunications cabinet wall 12, thereby securing the ceiling 26 of the removable shroud 22 to onto the upper mounting member 16 (and telecommunications cabinet 11).

Figure 4A:
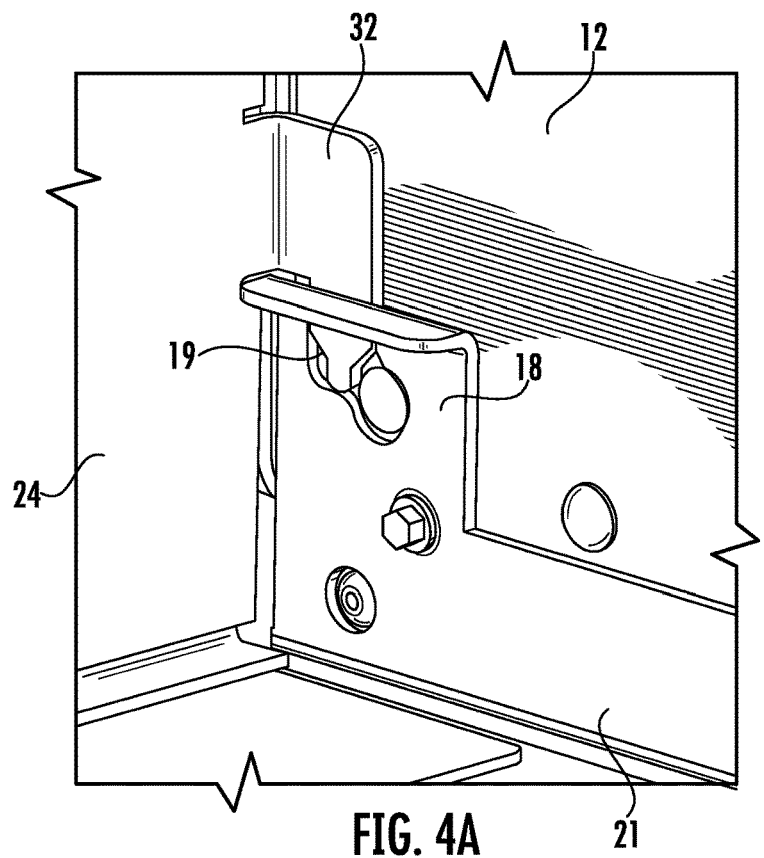
FIG. 4A is left perspective view of a mounting hook of the shroud of FIG. 3A inserted into a lower mounting member of the telecommunications cabinet of FIG. 1.
Figure 4B:
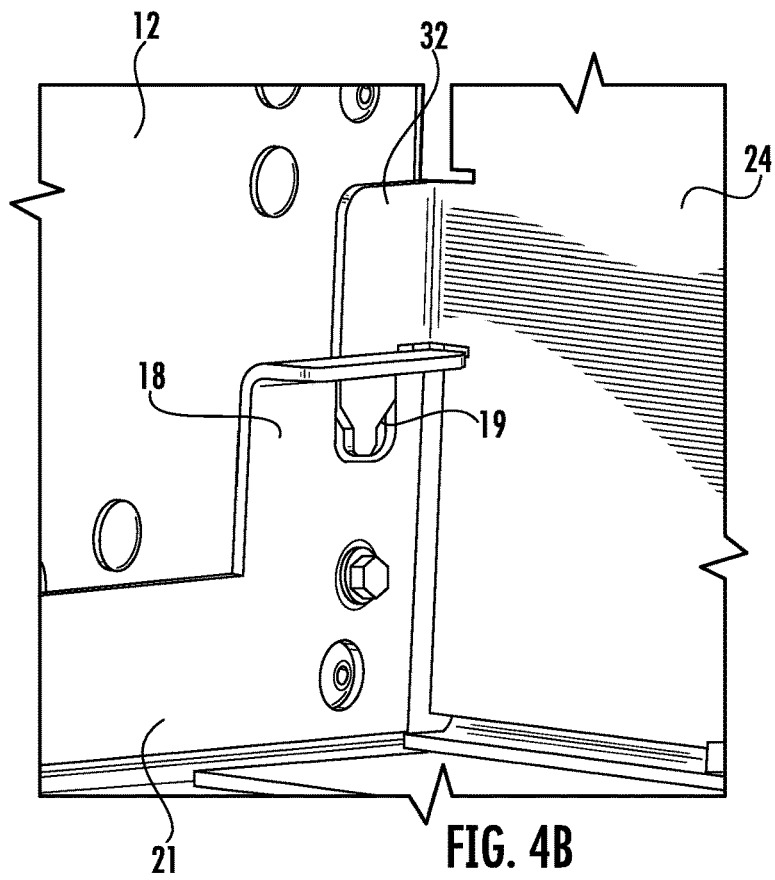
FIG. 4B is perspective view of an opposite mounting hook of the shroud of FIG. 3A inserted into an opposite lower mounting member of the telecommunications cabinet of FIG. 1.

In some embodiments, the removable shroud 22 may comprise at least two mounting hooks 32. The mounting hooks 32 may be positioned such that they extend perpendicular to and downwardly from the side wall 24 of the removable shroud 22. As shown in FIGS. 4A and 4B, the mounting hooks 32 can be each sized to insert into a respective slot 19 of a lower mounting member 18 located on the telecommunications cabinet wall 12.

In some embodiments, the mounting hooks 32 may be shaped or configured to guide the mounting hooks 32 into position with the lower mounting member 18. For example, in some embodiments, the end of the mounting hook 32 inserted into the slot 19 of the lower mounting member 18 may have a smaller width than the end of the mounting hook 32 extending from the side wall 24 of the removable shroud 22. In some embodiments, the slots 19 of the lower mounting members 18 may be shaped such that they guide the mounting hooks 32 into a secured position within the lower mounting member 18. For example, the openings of the slots 19 of the lower mounting members 18 may be wider than the bases of the slots 19 of the lower mounting members 18.

In some embodiments, the mounting hooks 32 may be attached to the removable shroud 22 in number of different ways, for example, via bolts, screws, welds or the like. In some embodiments, the mounting hooks 32 may be formed integrally with the removable shroud 22. In some embodiments, the mounting hooks 32 may extend downwardly from a lower end portion of separate side walls 24 of the removable shroud 22.

Figure 5C:
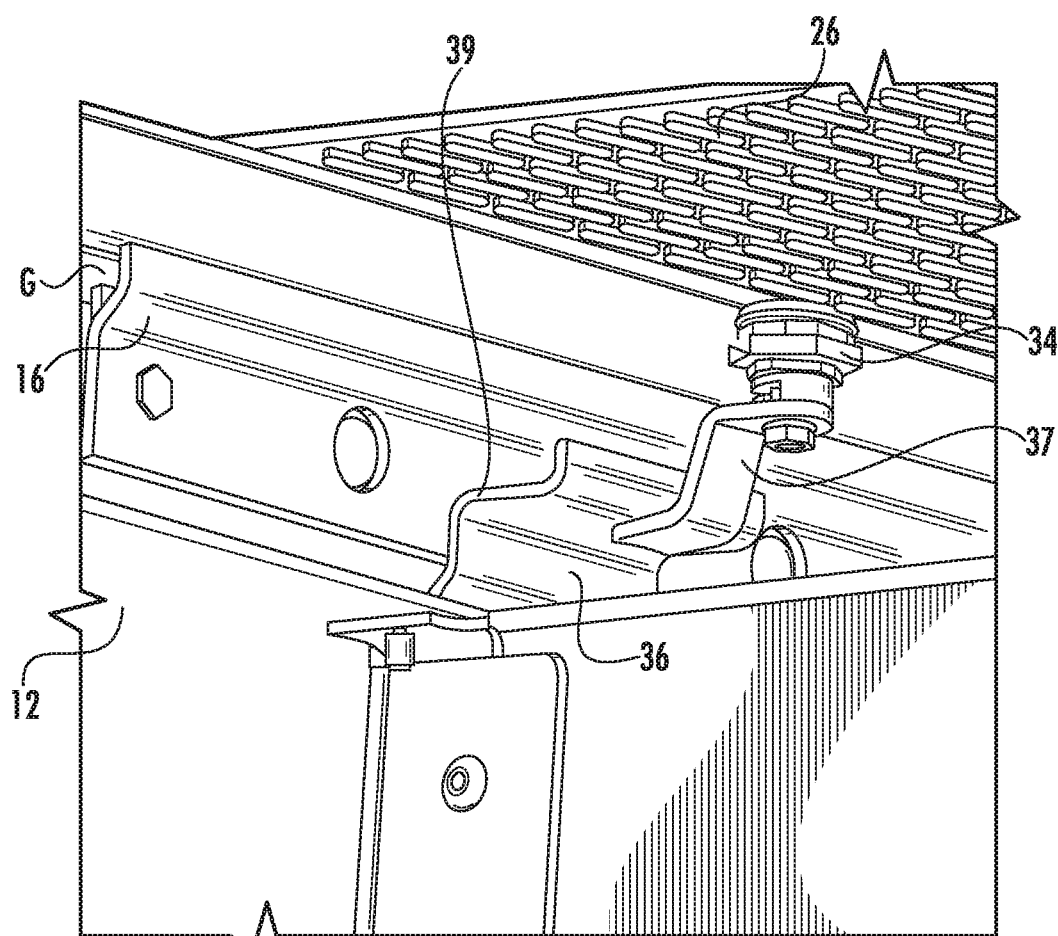
FIG. 5C is a front left perspective view of the locking device and locking member of FIG. 5A.

Referring now to FIGS. 5A-5C, in some embodiments, the removable shroud 22 may comprise a locking device 34. The locking device 34 can be configured to engage with the locking member 36 of the telecommunications cabinet wall 12. In some embodiments, the locking device 34 may be attached to the removable shroud 22 in number of different ways, for example, via bolts, screws, weld or the like. In some embodiments, the locking device 34 may be a lockable quarter-turn latch, with a locking finger 37 that pivots 90 degrees to engage with and disengage from the locking member arm 39 of the locking member 36. In some embodiments, the locking device 34 may be a lockable slide bolt latch, with a bolt that slides back-and-forth to engage and disengage from the locking member 36. In some embodiments, the removable shroud 22 may comprise more than one locking device 34.

The removable shroud 22 is secured to the telecommunications cabinet wall 12 when latching member 27 or downwardly-bent edge 30 of the ceiling 26 is received by the upper mounting member 16, the mounting hooks 32 are inserted into the lower mounting members 18, and the locking device 34 is engaged with the locking member 36 in a locked position. As such, the telecommunications cabinet assembly 10 has the ability to protect the telecommunications radios 14 from theft, as well as protect the telecommunications radios 14 from certain harsh environmental conditions, such as weather.

Further, in some embodiments, the removable shroud 22 may comprise perforations 38. In some embodiments, the perforations 38 may be located on the side walls 24 and/or ceiling 26 of the removable shroud 22. The telecommunications radios 14 typically generate heat during operation. The perforations 38 in the removable shroud 22 can allow some of the heat generated by the telecommunications radios 14 to escape when encapsulated by the removable shroud 22, thereby helping to prevent the telecommunications radios 14 from overheating. The perforations 38 can also help reduce the overall weight of the removable shroud 22, again making installation and removal less burdensome.

Methods for protecting a telecommunications radio 14 mounted to an exterior of a telecommunications cabinet wall 12 are also provided. In some embodiments, the method comprises providing a removable shroud 22 having three side walls 24 and a ceiling 26 that form an interior cavity dimensioned to fit over the telecommunications radio 14, the ceiling 26 of the removable shroud 22 having a latching member 27 (e.g., a downwardly-bent edge 30), at least two mounting hooks 32 attached to the removable shroud 22, and a locking device 34 attached to the removable shroud 22; positioning the removable shroud 22 over the telecommunications radio 14 such that (a) the latching member 27 is received by an upper mounting member 16 attached to the telecommunications cabinet wall 12, and (b) each of the at least two mounting hooks 32 insert into a respective lower mounting member 18 attached to the telecommunications cabinet wall 12; and engaging the locking device 34 with a locking member 36 attached to the telecommunications cabinet wall 12 to prevent the removal of the removable shroud 22 from the telecommunications cabinet wall 12.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. The invention is defined by the following claims, with equivalents of the claims to be included therein.

That which is claimed is:

1. A radio cover assembly, comprising:
   a removable shroud, the removable shroud comprising three side walls and a ceiling that form an interior cavity dimensioned to fit over a telecommunications radio mounted on an exterior side of a telecommunications cabinet wall, the ceiling of the removable shroud having a latching member configured to be received in an upper mounting member on the exterior side of the telecommunications cabinet wall;
   at least two mounting hooks attached to the removable shroud, each of the at least two mounting hooks sized to insert into a respective lower mounting member on the exterior side of the telecommunications cabinet wall; and
   a locking device attached to the removable shroud and configured to engage a locking member attached to the exterior side of the telecommunications cabinet wall.

2. The radio cover assembly of claim 1, wherein the locking device is a lockable quarter-turn latch.

3. The radio cover assembly of claim 1, wherein the latching member is a downwardly-bend edge of the ceiling of the removable shroud.

4. The radio cover assembly of claim 1, wherein the removable shroud comprises steel or aluminum.

5. The radio cover assembly of claim 1, wherein the removable shroud comprises perforations.

6. The radio cover assembly of claim 5, wherein the perforations are located on the side walls and/or ceiling of the removable shroud.

7. The radio cover assembly of claim 1, wherein the at least two mounting hooks are integrally formed with the removable shroud.

8. The radio cover assembly of claim 1, wherein each of the at least two mounting hooks extend perpendicularly to and downwardly from a lower end portion of a separate side wall of the removable shroud.

9. A telecommunications cabinet assembly, comprising:
   a telecommunications cabinet having a cavity for housing telecommunications equipment, the telecommunications cabinet comprising:
      at least one telecommunications radio mounted to a cabinet wall exterior to the cavity;
      an upper mounting member attached to an exterior side of the cabinet wall;
      at least two lower mounting members on the exterior side of the cabinet wall; and
      a locking member attached to the exterior side of the cabinet wall; and
   a radio cover assembly, the radio cover assembly comprising:
      a removable shroud, the removable shroud comprising three side walls and a ceiling that form an interior cavity dimensioned to fit over the at least one telecommunications radio, the ceiling of the removable shroud having a latching member received in the upper mounting member;
      at least two mounting hooks attached to the removable shroud, each of the at least two mounting hooks inserted into a respective lower mounting member; and
      a locking device attached to the removable shroud, the locking device configured to engage with the locking member, thereby securing the removable shroud to the cabinet wall when the locking device is in a locked position.

10. The telecommunications cabinet assembly of claim 9, wherein the locking device is a lockable quarter-turn latch.

11. The telecommunications cabinet assembly of claim 9, wherein the latching member is a downwardly-bent edge of the ceiling of the removable shroud.

12. The telecommunications cabinet assembly of claim 9, wherein the removable shroud comprises steel or aluminum.

13. The telecommunications cabinet assembly of claim 9, wherein the removable shroud comprises perforations.

14. The telecommunications cabinet assembly of claim 13, wherein the perforations are located on the side walls of the removable shroud.

15. The telecommunications cabinet assembly of claim 9, wherein the at least two mounting hooks are integrally formed with the removable shroud.

16. The telecommunications cabinet assembly of claim 9, wherein each of the at least two mounting hooks extend perpendicularly to and downwardly from a lower end portion of a separate side wall of the removable shroud.

17. The telecommunications cabinet assembly of claim 9, wherein the equipment housed in the telecommunications cabinet comprises multi-carrier power amplifiers, house power cells, routers, switching equipment, transmission equipment, power suppliers, batteries, wireless cell site backhaul equipment, baseband units, Fiber panels, and/or OVPs.

* * * * *